United States Patent
Lee et al.

(10) Patent No.: US 11,903,263 B2
(45) Date of Patent: Feb. 13, 2024

(54) METHOD OF MANUFACTURING DISPLAY DEVICE

(71) Applicant: Samsung Display Co., Ltd., Yongin-si (KR)

(72) Inventors: Dongha Lee, Yongin-si (KR); Jongjang Park, Yongin-si (KR); Seulgi Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 322 days.

(21) Appl. No.: 17/477,465

(22) Filed: Sep. 16, 2021

(65) Prior Publication Data

US 2022/0223665 A1 Jul. 14, 2022

(30) Foreign Application Priority Data

Jan. 8, 2021 (KR) .................. 10-2021-0002586

(51) Int. Cl.
*H10K 59/122* (2023.01)
*H10K 71/00* (2023.01)
*H10K 59/12* (2023.01)

(52) U.S. Cl.
CPC ........... *H10K 59/122* (2023.02); *H10K 71/00* (2023.02); *H10K 59/1201* (2023.02)

(58) Field of Classification Search
CPC .. H10K 59/122; H10K 59/1201; H10K 71/00; H10K 71/12
See application file for complete search history.

(56) References Cited

U.S. PATENT DOCUMENTS

| | | | |
|---|---|---|---|
| 9,070,905 B2 | 6/2015 | Ishino et al. | |
| 9,640,597 B2 | 5/2017 | Dai et al. | |
| 9,991,321 B2 | 6/2018 | Jeon et al. | |
| 10,388,709 B2 | 8/2019 | Jia et al. | |
| 2013/0143346 A1* | 6/2013 | Nishiyama | H05B 33/10 438/46 |
| 2014/0139102 A1* | 5/2014 | Jeon | H10K 59/121 445/24 |
| 2015/0028310 A1* | 1/2015 | Dai | H10K 50/17 257/40 |
| 2019/0038625 A1 | 2/2019 | Hayes et al. | |
| 2020/0168678 A1* | 5/2020 | Yoon | H10K 71/135 |
| 2022/0208902 A1* | 6/2022 | Kim | H10K 59/88 |

FOREIGN PATENT DOCUMENTS

| | | |
|---|---|---|
| KR | 10-1795428 | 11/2017 |
| KR | 10-2024098 | 9/2019 |
| KR | 10-2020-0018799 | 2/2020 |

* cited by examiner

*Primary Examiner* — Mark W Tornow
(74) *Attorney, Agent, or Firm* — H.C. Park & Associates, PLC

(57) ABSTRACT

A method of manufacturing a display device includes forming a first electrode on a substrate, forming a bank layer on the first electrode, wherein the bank layer includes an opening portion exposing at least a portion of the first electrode, forming a first bank layer and a second bank layer by baking the bank layer, wherein the second bank layer is on the first bank layer and has liquid repellency, forming a first layer on the first electrode, and forming a third bank layer and a fourth bank layer by baking the first bank layer and the second bank layer, wherein the fourth bank layer is on the third bank layer and has liquid repellency, wherein the fourth bank layer is thinner than the second bank layer.

20 Claims, 14 Drawing Sheets

METHOD OF MANUFACTURING DISPLAY DEVICE

CROSS-REFERENCE TO RELATED APPLICATION

This application claims priority from and the benefit of Korean Patent Application No. 10-2021-0002586, filed on Jan. 8, 2021, which is hereby incorporated by reference for all purposes as if fully set forth herein.

BACKGROUND

Field

Embodiments of the invention relate generally to a method of manufacturing a display device.

Discussion of the Background

As the information society develops, demand for display devices for displaying an image has been increasing in various forms. The field of display devices has rapidly changed into flat-panel display (FPD) devices, which are thin, light, and capable of having a large area, the FPD devices replacing the cathode-ray tube (CRT) which has a large volume. Examples of an FPD device include a liquid crystal display (LCD) device, a plasma display panel (PDP), an organic light-emitting display device, and an electrophoretic display (EPD) device.

Among the display devices, an organic light-emitting display device may include an organic light-emitting diode (OLED) including a first electrode, a second electrode, and an emission layer. When a voltage is applied to the first electrode and the second electrode of the OLED, light (e.g., visible light) may be emitted from the emission layer. The emission layer of the OLED may be formed on the first electrode by a solution process.

The above information disclosed in this Background section is only for understanding of the background of the inventive concepts, and, therefore, it may contain information that does not constitute prior art.

SUMMARY

One or more embodiments include films formed in a bank layer to have a uniform thickness by adjusting liquid repellency of the bank layer. However, such a technical problem is an example, and the disclosure is not limited thereto.

Additional features of the inventive concepts will be set forth in the description which follows, and, in part will be apparent from the description, or may be learned by practice of the inventive concepts.

According to one or more embodiments, a method of manufacturing a display device includes forming a first electrode on a substrate, forming a bank layer on the first electrode, wherein the bank layer includes an opening portion exposing at least a portion of the first electrode, forming a first bank layer and a second bank layer by baking the bank layer, wherein the second bank layer is on the first bank layer and has liquid repellency, forming a first layer on the first electrode, and forming a third bank layer and a fourth bank layer by baking the first bank layer and the second bank layer, wherein the fourth bank layer is on the third bank layer and has liquid repellency, wherein the fourth bank layer is thinner than the second bank layer.

The forming of the first bank layer and the second bank layer by baking the bank layer may include forming the first bank layer and the second bank layer by baking the bank layer at 150° C. to 250° C. for 8 to 12 minutes.

The first bank layer may have a first thickness from an upper surface of the first electrode, and the second bank layer may have a second thickness from an upper surface of the first bank layer.

The first layer may have a third thickness from the upper surface of the first electrode, and the third thickness may be equal to or less than the first thickness.

The forming of the third bank layer and the fourth bank layer by baking the first bank layer and the second bank layer may include forming the third bank layer and the fourth bank layer by baking the first bank layer and the second bank layer at 150° C. to 250° C. for 13 to 25 minutes.

The third bank layer may have a fourth thickness from the upper surface of the first electrode, and the fourth bank layer may have a fifth thickness from an upper surface of the third bank layer.

The fourth thickness may be greater than the first thickness.

The second thickness may be greater than the fifth thickness.

The method may further include, after the forming of the third bank layer and the fourth bank layer, forming a second layer on the first layer.

The second layer may have a sixth thickness from an upper surface of the first layer, and the fourth thickness may be equal to or greater than a sum of the third thickness and the sixth thickness.

The method may further include, after the forming of the second layer, forming a fifth bank layer and a sixth bank layer by baking the third bank layer and the fourth bank layer, wherein the sixth bank layer may be on the fifth bank layer and have liquid repellency.

The forming of the fifth bank layer and the sixth bank layer by baking the third bank layer and the fourth bank layer may include forming the fifth bank layer and the sixth bank layer by baking the third bank layer and the fourth bank layer at 150° C. to 250° C. for 13 to 25 minutes.

The fifth bank layer may have a seventh thickness from the upper surface of the first electrode, and the sixth bank layer may have an eighth thickness from an upper surface of the fifth bank layer.

The seventh thickness may be greater than the fourth thickness.

The eighth thickness may be less than the fifth thickness.

The method may further include, after the forming of the fifth bank layer and the sixth bank layer, forming a third layer on the second layer.

The method may further include forming a second electrode above the first electrode.

The bank layer may have a thickness of 0.5 μm to 1.5 μm.

The first layer may be formed by a solution process.

The first layer may be one of a hole injection layer, a hole transport layer, and an emission layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
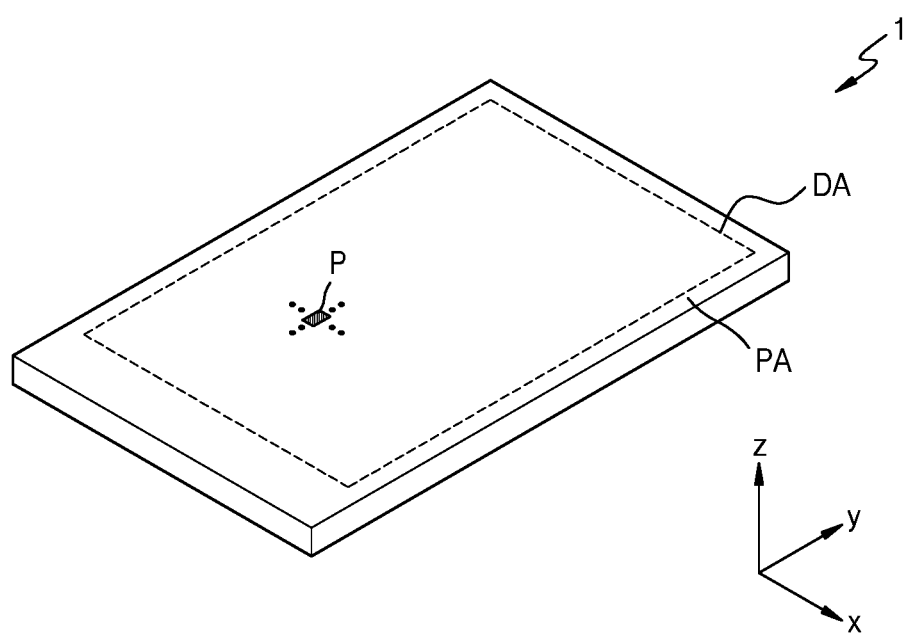
FIG. 1 is a schematic perspective view illustrating a display device according to an embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are illustrated in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments will be described with reference to the accompanying drawings, and those elements that are the same or are in correspondence with each other are rendered the same reference numeral in the drawings.

FIG. 1 is a schematic perspective view of a display device 1 according to an embodiment.

Referring to FIG. 1, the display device 1 may include a display area DA and a peripheral area PA arranged around the display area DA. The peripheral area PA may at least partially surround the display area DA. The display device 1 may provide an image by using light emitted from pixels P arranged in the display area DA, and the peripheral area PA may be a non-display area in which no image is displayed.

Although an organic light-emitting display device is described below as an example of the display device 1 according to an embodiment, a display device is not limited thereto. In an embodiment, the display device 1 may be a display device such as an inorganic light-emitting display device (or an inorganic electroluminescent (EL) display device) or a quantum dot light-emitting display device. For example, an emission layer of a display element provided in the display device 1 may include an organic material, may include an inorganic material, may include quantum dots, may include an organic material and quantum dots, or may include an inorganic material and quantum dots.

Although FIG. 1 illustrates the display device 1 including a flat display surface, the disclosure is not limited thereto. In an embodiment, the display device 1 may include a stereoscopic display surface or a curved display surface.

When the display device 1 includes a stereoscopic display surface, the display device 1 includes a plurality of display areas indicating different directions, and may include, for example, a polygonal columnar display surface. In an embodiment, when the display device 1 includes a curved display surface, the display device 1 may be implemented in various forms such as a flexible, foldable, or rollable display device.

FIG. 1 illustrates the display device 1 applicable to a mobile phone terminal. Although not illustrated, an electronic module, a camera module, a power module, and the like mounted on a mainboard are arranged together with the display device 1 in a bracket or a case, etc., thereby constituting a mobile phone terminal. Particularly, the display device 1 may be applied to large-sized electronic devices such as televisions and monitors and may also be applied to small and medium-sized electronic devices such as tablet personal computers, vehicle navigation systems, game consoles, and smart watches.

Although FIG. 1 illustrates a case where the display area DA of the display device 1 has a quadrilateral shape, a shape of the display area DA may be a circle, an oval, or a polygon such as a triangle or a pentagon.

The display device 1 may include the pixels P arranged in the display area DA. Each of the pixels P may include an organic light-emitting diode. Each of the pixels P may emit, for example, red, green, blue, or white light, through the organic light-emitting diode. A pixel P may be understood as a pixel that emits light of one of red, green, blue, and white colors as described above.

Figure 2:
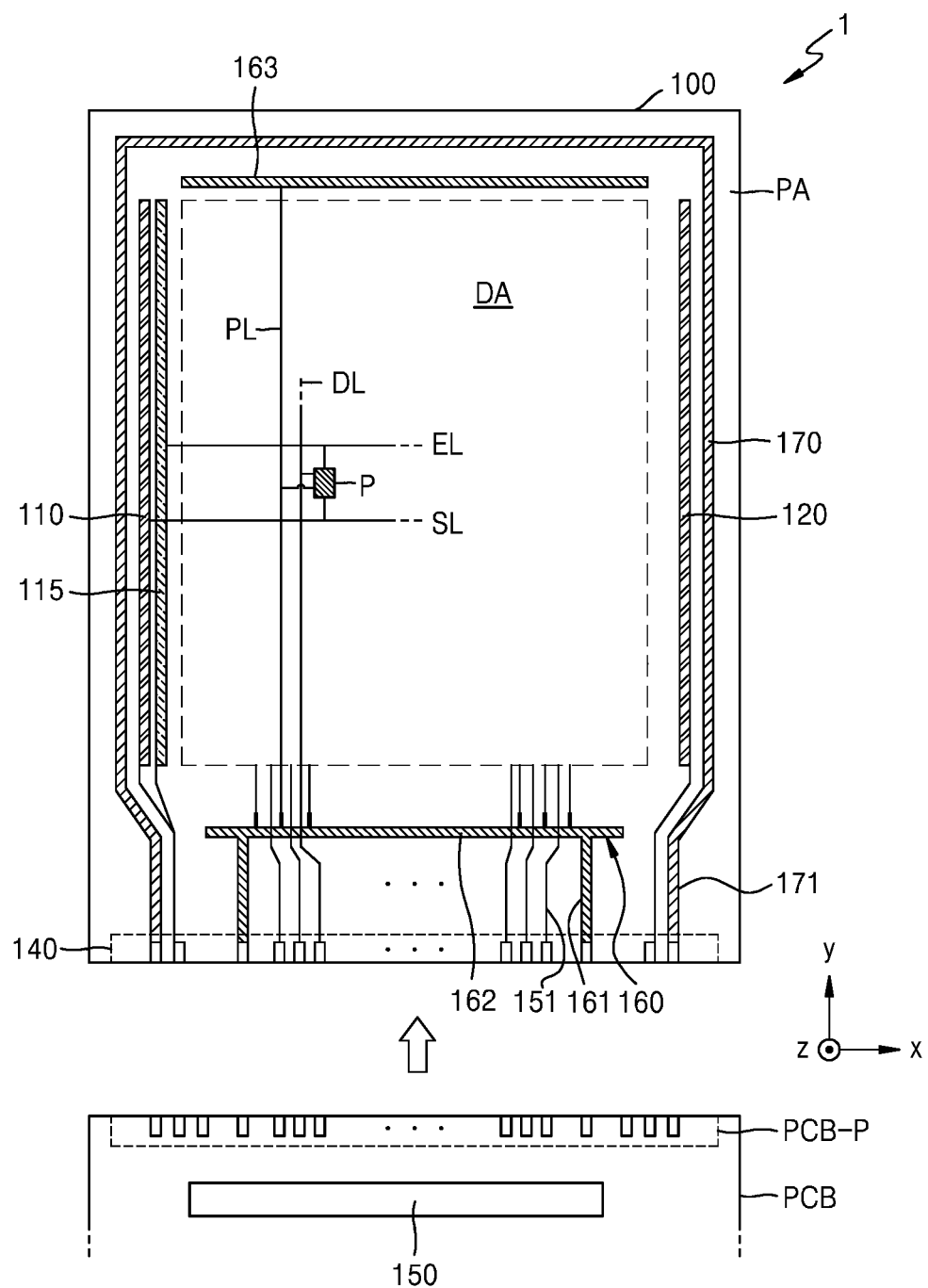
FIG. 2 is a schematic plan view illustrating a display device according to an embodiment.

FIG. 2 is a schematic plan view of the display device 1 according to an embodiment.

Referring to FIG. 2, the display device 1 may include the pixels P arranged in the display area DA. Each pixel P may be electrically connected to outer circuits arranged in the peripheral area PA. A first scan driving circuit 110, a first emission driving circuit 115, a second scan driving circuit 120, a terminal 140, a data driving circuit 150, a first power supply line 160, and a second power supply line 170 may be arranged in the peripheral area PA.

The first scan driving circuit 110 may provide a scan signal to each pixel P through a scan line SL. The first emission driving circuit 115 may provide an emission control signal to each pixel P through an emission control line EL. The second scan driving circuit 120 may be parallel to the first scan driving circuit 110 with the display area DA therebetween. In an embodiment, some of the pixels P arranged in the display area DA may be electrically connected to the first scan driving circuit 110, and the others may be electrically connected to the second scan driving circuit 120. In an embodiment, the second scan driving circuit 120 may be omitted.

The first emission driving circuit 115 may be spaced apart from the first scan driving circuit 110 in a direction x and arranged in the peripheral area PA. In addition, the first emission driving circuit 115 may alternate with the first scan driving circuit 110 in a direction y.

The terminal 140 may be arranged on one side of a substrate 100. The terminal 140 may not be covered by an insulating layer but may be exposed and be electrically connected to a printed circuit board PCB. A terminal PCB-P of the printed circuit board PCB may be electrically connected to the terminal 140 of the display device 1. The printed circuit board PCB may transmit a signal or power of a controller (not illustrated) to the display device 1. Control signals generated by the controller may be transmitted to the first scan driving circuit 110, the first emission driving circuit 115, and the second scan driving circuit 120, respectively, through the printed circuit board PCB. The controller may provide a first power voltage ELVDD (see FIG. 3) and a second power voltage ELVSS (see FIG. 3) to the first power supply line 160 and the second power supply line 170, respectively, through a first connection line 161 and a second connection line 171. The first power voltage ELVDD may be provided to each pixel P through a driving voltage line PL connected to the first power supply line 160, and the second power voltage ELVSS may be provided to a second electrode of each pixel P connected to the second power supply line 170.

The data driving circuit 150 may be electrically connected to a data line DL. A data signal of the data driving circuit 150 may be provided to each pixel P through a connection line 151 connected to the terminal 140 and the data line DL connected to the connection line 151.

Although FIG. 2 illustrates the data driving circuit 150 arranged on the printed circuit board PCB, in an embodiment, the data driving circuit 150 may be arranged on the substrate 100. For example, the data driving circuit 150 may be arranged between the terminal 140 and the first power supply line 160.

The first power supply line 160 may include a first sub-line 162 and a second sub-line 163 extending in parallel along the direction x with the display area DA therebetween. The second power supply line 170 may partially surround the display area DA in a loop shape having one side open.

Figure 3:
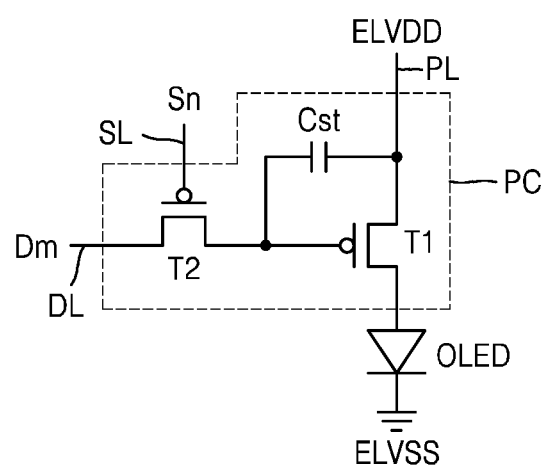
FIGS. 3 and 4 are equivalent circuit diagrams illustrating a pixel which may be included in a display device according to an embodiment.
Figure 4:
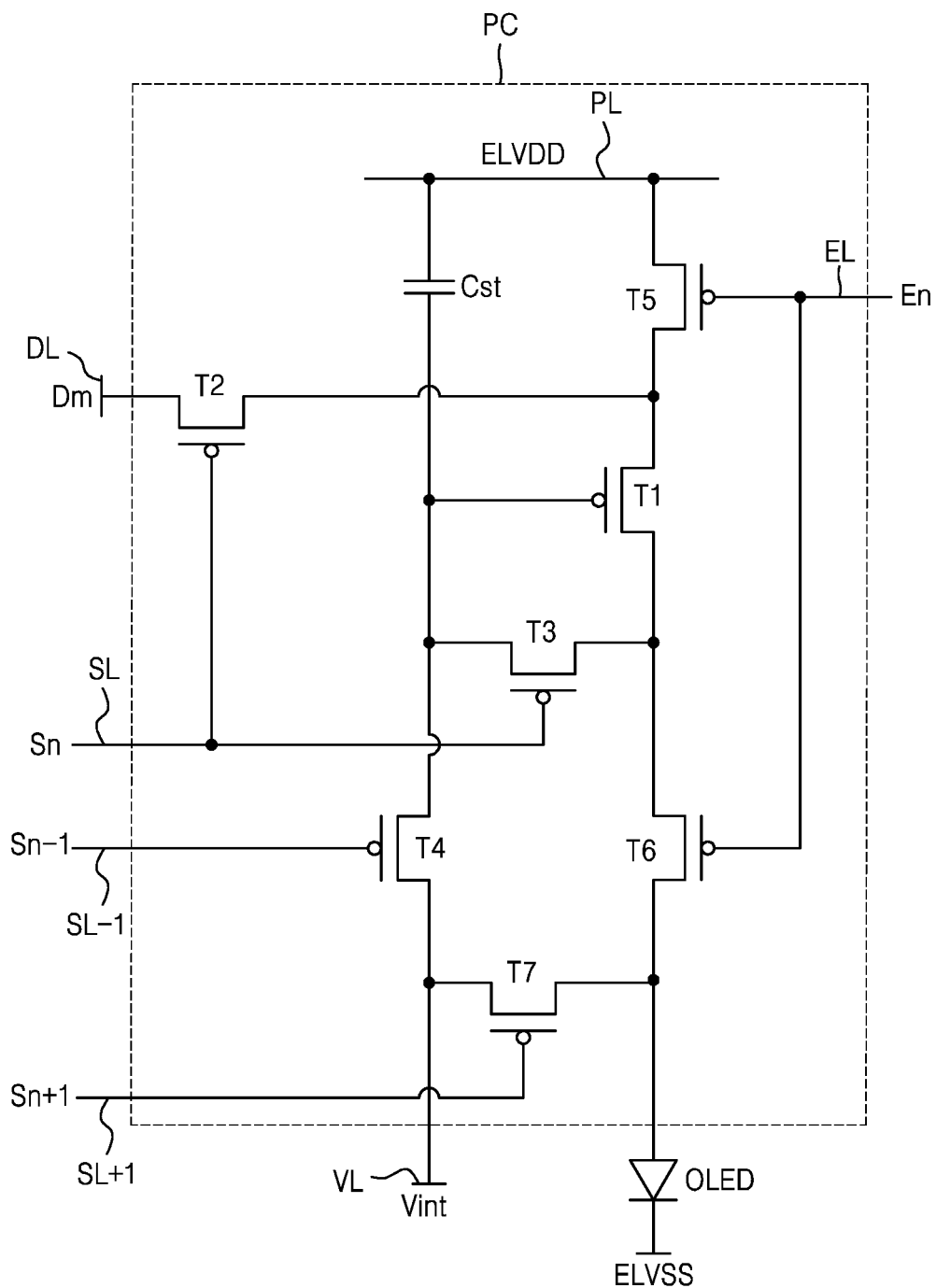

FIGS. 3 and 4 are equivalent circuit diagrams of a pixel which may be included in a display device according to an embodiment.

Referring to FIG. 3, a pixel circuit PC may be connected to an organic light-emitting diode OLED to implement emission of pixels. The pixel circuit PC may include a driving thin-film transistor T1, a switching thin-film transistor T2, and a storage capacitor Cst. The switching thin-film transistor T2 may be connected to the scan line SL and the data line DL and may be configured to transmit a data signal Dm input through the data line DL to the driving thin-film transistor T1 according to a scan signal Sn input through the scan line SL.

The storage capacitor Cst may be connected to the switching thin-film transistor T2 and the driving voltage line PL and may store a voltage corresponding to a difference between a voltage received from the switching thin-film transistor T2 and the first power voltage ELVDD supplied to the driving voltage line PL.

The driving thin-film transistor T1 may be connected to the driving voltage line PL and the storage capacitor Cst and may be configured to control a driving current flowing through the organic light-emitting diode OLED from the driving voltage line PL in response to a voltage value stored in the storage capacitor Cst. The organic light-emitting diode OLED may emit light having certain brightness according to the driving current.

Although FIG. 3 illustrates the pixel circuit PC including two thin-film transistors and one storage capacitor, the disclosure is not limited thereto.

Referring to FIG. 4, the pixel circuit PC may include the driving thin-film transistor T1, the switching thin-film transistor T2, a compensation thin-film transistor T3, a first initialization thin-film transistor T4, an operation control thin-film transistor T5, an emission control thin-film transistor T6, a second initialization thin-film transistor T7, and the storage capacitor Cst.

Although FIG. 4 illustrates signal lines, for example, the scan line SL, a previous scan line SL−1, a next scan line SL+1, the emission control line EL, and the data line DL, an initialization voltage line VL, and the driving voltage line PL provided for each pixel circuit PC, the disclosure is not limited thereto. In an embodiment, at least one of signal lines, for example, the scan line SL, the previous scan line SL−1, the next scan line SL+1, the emission control line EL, and the data line DL, and/or the initialization voltage line VL may be shared by neighboring pixel circuits.

A drain electrode of the driving thin-film transistor T1 may be electrically connected to the organic light-emitting diode OLED via the emission control thin-film transistor T6. The driving thin-film transistor T1 may be configured to receive the data signal Dm according to a switching operation of the switching thin-film transistor T2 and supply a driving current to the organic light-emitting diode OLED.

A gate electrode of the switching thin-film transistor T2 may be connected to the scan line SL, and a source electrode of the switching thin-film transistor T2 may be connected to the data line DL. A drain electrode of the switching thin-film transistor T2 may be connected to a source electrode of the driving thin-film transistor T1 and may also be connected to the driving voltage line PL via the operation control thin-film transistor T5.

The switching thin-film transistor T2 may be turned on according to the scan signal Sn received through the scan line SL to perform a switching operation to transmit the data signal Dm transmitted through the data line DL to the source electrode of the driving thin-film transistor T1.

A gate electrode of the compensation thin-film transistor T3 may be connected to the scan line SL. A source electrode of the compensation thin-film transistor T3 may be connected to the drain electrode of the driving thin-film transistor T1 and may also be connected to a first electrode of the organic light-emitting diode OLED via the emission control thin-film transistor T6. A drain electrode of the compensation thin-film transistor T3 may be connected to one electrode of the storage capacitor Cst, a source electrode of the first initialization thin-film transistor T4, and a gate electrode of the driving thin-film transistor T1. The compensation thin-film transistor T3 is turned on according to the scan signal Sn received through the scan line SL to diode-connect the driving thin-film transistor T1 by connecting the gate electrode and the drain electrode of the driving thin-film transistor T1 to each other.

A gate electrode of the first initialization thin-film transistor T4 may be connected to the previous scan line SL−1. A drain electrode of the first initialization thin-film transistor T4 may be connected to the initialization voltage line VL. The source electrode of the first initialization thin-film transistor T4 may be connected to one electrode of the storage capacitor Cst, the drain electrode of the compensation thin-film transistor T3, and the gate electrode of the driving thin-film transistor T1. The first initialization thin-film transistor T4 may be turned on according to a previous scan signal Sn−1 received through the previous scan line Sn−1 to perform an initialization operation to initialize a voltage of the gate electrode of the driving thin-film transistor T1 by transmitting an initialization voltage Vint to the gate electrode of the driving thin-film transistor T1.

A gate electrode of the operation control thin-film transistor T5 may be connected to the emission control line EL. A source electrode of the operation control thin-film transistor T5 may be connected to the driving voltage line PL. A drain electrode of the operation control thin-film transistor T5 is connected to the source electrode of the driving thin-film transistor T1 and the drain electrode of the switching thin-film transistor T2.

A gate electrode of the emission control thin-film transistor T6 may be connected to the emission control line EL. A source electrode of the emission control thin-film transistor T6 may be connected to the drain electrode of the driving thin-film transistor T1 and the source electrode of the compensation thin-film transistor T3. A drain electrode of the emission control thin-film transistor T6 may be electrically connected to the first electrode of the organic light-emitting diode OLED. As the operation control thin-film transistor T5 and the emission control thin-film transistor T6 are simultaneously turned on according to an emission control signal En received through the emission control line EL, the first power voltage ELVDD is transmitted to the organic light-emitting diode OLED, and a driving current flows through the organic light-emitting diode OLED.

A gate electrode of the second initialization thin-film transistor T7 may be connected to the next scan line SL+1. A source electrode of the second initialization thin-film transistor T7 may be connected to the first electrode of the organic light-emitting diode OLED. A drain electrode of the second initialization thin-film transistor T7 may be connected to the initialization voltage line VL. The second initialization thin-film transistor T7 may be turned on according to a next scan signal Sn+1 received through the next scan line SL+1 to initialize the first electrode of the organic light-emitting diode OLED.

Although FIG. 4 illustrates the first initialization thin-film transistor T4 and the second initialization thin-film transistor T7 respectively connected to the previous scan line SL−1 and the next scan line SL+1, the disclosure is not limited thereto. In an embodiment, the first initialization thin-film transistor T4 and the second initialization thin-film transistor T7 may both be connected to the previous scan line SL−1 and driven according to the previous scan signal Sn−1.

The other electrode of the storage capacitor Cst may be connected to the driving voltage line PL. One electrode of the storage capacitor Cst may be connected to the gate electrode of the driving thin-film transistor T1, the drain electrode of the compensation thin-film transistor T3, and the source electrode of the first initialization thin-film transistor T4.

A second electrode (e.g., a cathode) of the organic light-emitting diode OLED may receive the second power voltage ELVSS. The organic light-emitting diode OLED may receive a driving current from the driving thin-film transistor T1 and emit light.

The pixel circuit PC is not limited to the number of thin-film transistors and storage capacitors and the circuit design described with reference to FIG. 4, and the number and circuit design may be variously changed.

FIGS. 5 to 14 are schematic cross-sectional views of a method of manufacturing a display device, according to an embodiment.

Hereinafter, a method of manufacturing a display device will be described with reference to FIGS. 5 to 14.

Figure 5:
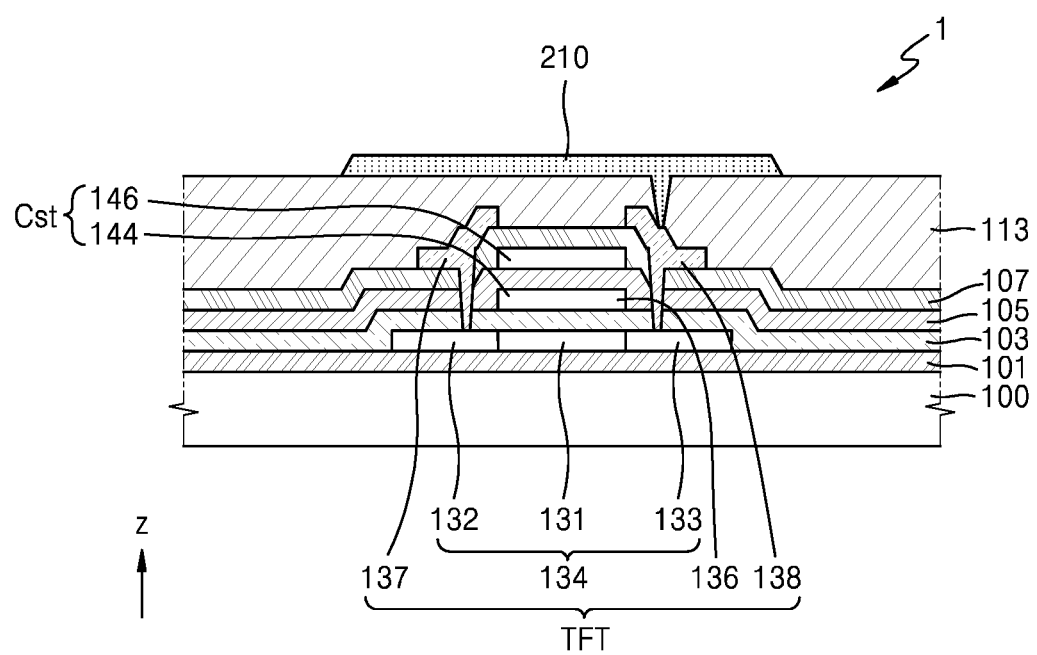
FIGS. 5, 6, 7, 8, 9, 10, 11, 12, 13, and 14 are schematic cross-sectional views illustrating a method of manufacturing a display device, according to an embodiment.

Referring to FIG. 5, the display device 1 may include the substrate 100. The substrate 100 may include a glass material, a ceramic material, a metal material, or a flexible or bendable material. In an embodiment, the substrate 100 may include polymer resin such as polyethersulfone, polyacrylate, polyetherimide, polyethylene naphthalate, polyethylene terephthalate, polyphenylene sulfide, polyarylate, polycarbonate, or cellulose acetate propionate. The substrate 100 may have a single-layer structure or a multilayer structure of the material described above, and may further include an inorganic layer in the case of a multilayer structure. In an embodiment, the substrate 100 may have a structure of organic material/inorganic material/organic material.

A buffer layer 101 may be formed on the substrate 100. The buffer layer 101 may be positioned on the substrate 100 to reduce or prevent penetration of a foreign material, moisture, or outside air from below the substrate 100 and may provide a flat surface on the substrate 100. The buffer layer 101 may include an inorganic insulating material such as silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), or zinc oxide (ZnO). In an embodiment, the buffer layer 101 may have a single-layer structure or a multilayer structure.

A thin-film transistor TFT may be formed on the buffer layer 101. In an embodiment, the thin-film transistor TFT may include a semiconductor layer 134 and a gate electrode 136, source electrode 137, and drain electrode 138 disposed above the semiconductor layer 134.

The semiconductor layer 134 may be formed on the buffer layer 101. The semiconductor layer 134 may include a channel region 131 overlapping the gate electrode 136 and a source region 132 and a drain region 133 arranged on both sides of the channel region 131. The source region 132 and drain region 133 may have impurity concentrations higher than that of the channel region 131. The impurities may include an N-type impurity or a P-type impurity. The source region 132 and the drain region 133 may be electrically connected to the source electrode 137 and the drain electrode 138, respectively.

The semiconductor layer 134 may include an oxide semiconductor and/or a silicon semiconductor. In an embodiment, when the semiconductor layer 134 includes an oxide semiconductor, the semiconductor layer 134 may include oxide of at least one material selected from the group including indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the semiconductor layer 134 may be ITZO (InSnZnO), IGZO (InGaZnO), or the like. In an embodiment, when the semiconductor layer 134 includes a silicon semiconductor, the semiconductor layer 134 may include amorphous silicon (a-Si) or low temperature polysilicon (LTPS) obtained by crystallizing amorphous silicon (a-Si).

A first insulating layer 103 may be formed on the semiconductor layer 134. The first insulating layer 103 may include at least one inorganic insulating material selected from the group including silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), or zinc oxide (ZnO). In an embodiment, the first insulating layer 103 may be provided in a single layer or multiple layers including the inorganic insulating material described above.

The gate electrode 136 may be formed on the first insulating layer 103. The gate electrode 136 may include one or more metals selected from among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu) in a single layer or multiple layers. The gate electrode 136 may be connected to a gate line configured to apply an electrical signal to the gate electrode 136.

A second insulating layer 105 may be formed on the gate insulating layer 136. The second insulating layer 105 may include at least one inorganic insulating material selected from the group including silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), or zinc oxide (ZnO). In an embodiment, the second insulating layer 105 may be provided in a single layer or multiple layers including the inorganic insulating material described above.

The storage capacitor Cst may be formed on the first insulating layer 103. The storage capacitor Cst may include a lower electrode 144 and an upper electrode 146. The lower electrode 144 may be formed on the first insulating layer 103, and the upper electrode 146 may be formed on the second insulating layer 105. The lower electrode 144 and the upper electrode 146 may at least partially overlap each other with the second insulating layer 105 therebetween.

In an embodiment, the lower electrode 144 of the storage capacitor Cst may overlap the gate electrode 136 of the thin-film transistor TFT, and the lower electrode 144 of the storage capacitor Cst may be integrally provided with the gate electrode 136 of the thin-film transistor TFT. In an embodiment, the lower electrode 144 of the storage capacitor Cst may be spaced apart from the gate electrode 136 of the thin-film transistor TFT and may be formed on the first insulating layer 103 as a separate and independent element.

In an embodiment, the upper electrode 146 may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W) and/or copper (Cu) and may be provided in a single layer or multiple layers of the material described above.

A third insulating layer 107 may be formed on the upper electrode 146. The third insulating layer 107 may include at least one inorganic insulating material selected from the group including silicon oxide ($SiO_X$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), or zinc oxide (ZnO). In an embodiment, the third insulating layer 107 may be provided in a single layer or multiple layers including the inorganic insulating material described above.

The source electrode 137 and/or the drain electrode 138 may be formed on the third insulating layer 107. The source electrode 137 and/or the drain electrode 138 may be electrically connected to the source region 132 and the drain region 133, respectively, through contact holes penetrating the first insulating layer 103, the second insulating layer 105, and the third insulating layer 107. The source electrode 137 and/or the drain electrode 138 may include a conductive material including molybdenum (Mo), aluminum (Al), copper (Cu), titanium (Ti), etc. and may include multiples layers or a single layer including the material described above. In an embodiment, the source electrode 137 and/or the drain electrode 138 may have a multilayer structure of titanium (Ti)/aluminum (Al)/titanium (Ti).

A planarization layer 113 may be formed on the source electrode 137 and/or the drain electrode 138. The planarization layer 113 may include, in a single layer or multiple layers, a film including an organic material or an inorganic material. In an embodiment, the planarization layer 113 may include a general commercial polymer such as benzocyclobutene (BCB), polyimide (PI), hexamethyldisiloxane (HMDSO), poly(methyl 2-methylpropenoate) (PMMA), or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. In an embodiment, the planarization layer 113 may include silicon oxide ($SiO_X$), silicon nitride ($SiN_X$) silicon oxynitride ($SiO_XN_Y$), aluminum oxide ($Al_2O_3$), titanium oxide ($TiO_2$), tantalum oxide ($Ta_2O_5$), hafnium oxide ($HfO_2$), or zinc oxide (ZnO). In an embodiment, after the planarization layer 113 is formed, polishing may be performed to provide a flat upper surface.

In an embodiment, a first electrode 210 may be formed above the substrate 100. In an embodiment, the first electrode 210 may be formed on the planarization layer 113. The first electrode 210 may be electrically connected to the source electrode 137 or the drain electrode 138 through a contact hole defined in the planarization layer 113.

The first electrode 210 may be a (semi)transmissive electrode or a reflective electrode. The first electrode 210 may include a reflective film including aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and a compound thereof, and a transparent or semitransparent electrode layer on the reflective film. The transparent or semitransparent electrode layer may include at least one selected from the group including indium tin oxide (ITO), indium zinc oxide (IZO), zinc oxide (ZnO), indium oxide ($In_2O_3$), indium gallium oxide (IGO), and aluminum zinc oxide (AZO). The first electrode 210 may have a stack structure of ITO/Ag/ITO.

In an embodiment, an emission layer (EML) may be formed above the first electrode 210, a hole injection layer (HIL) and/or a hole transport layer (HTL) may be formed under the EML, and an electron transport layer (ETL) and/or an electron injection layer (EIL) may be formed on the EML.

In an embodiment, the HIL may facilitate the injection of holes, and may include, but is not limited to, one or more selected from the group including HATCN, copper phthalocyanine (CuPc), poly(3,4)-ethylenedioxythiophene (PEDOT), polyaniline (PAM), and N, N-dinaphthyl-N, N'-diphenylbenzidine (NPD).

In an embodiment, the HTL may include, but is not limited to, a triphenylamine derivative having high hole mobility and excellent stability, such as N, N'-diphenyl-N, N'-bis(3-methylphenyl)-1,1'-bi-phenyl-4,4'-diamine (TPD) or N,N'-di(naphthalene-1-yl)-N,N'-diphenyl-benzidine (NPB), as a host of the HTL.

In an embodiment, the EML may include an organic material including a fluorescent or phosphorescent material that emits red, green, blue, or white light. The EML may include a low-molecular weight organic material or a polymer organic material.

When the EML includes a low-molecular weight organic material, the EML may include various organic materials such as copper phthalocyanine (CuPc), N,N'-Di(naphthalene-1-yl)-N,N'-diphenyl-benzidine (NPB), tris-8-hydroxyquinoline aluminum (Alq3), etc.

When the EML includes a polymer organic material, the EML may include a polymer material such as a polyphenylene vinylene (PPV)-based material, a polyfluorene-based material, etc.

In an embodiment, the ETL may facilitate the transport of electrons, and may include, but is not limited to, one or more selected from the group including tris(8-hydroxyquinolino) aluminum (Alq3), PBD, TAZ, Spiro-PBD, BAlq, lithium quinolate (Liq), BMB-3T, PF-6P, TPBI, COT, and SAlq.

In an embodiment, the EIL may include, but is not limited to, tris(8-hydroxyquinolino)aluminum (Alq3), PBD, TAZ, Spiro-PBD, BAlq, or SAlq.

Figure 6:
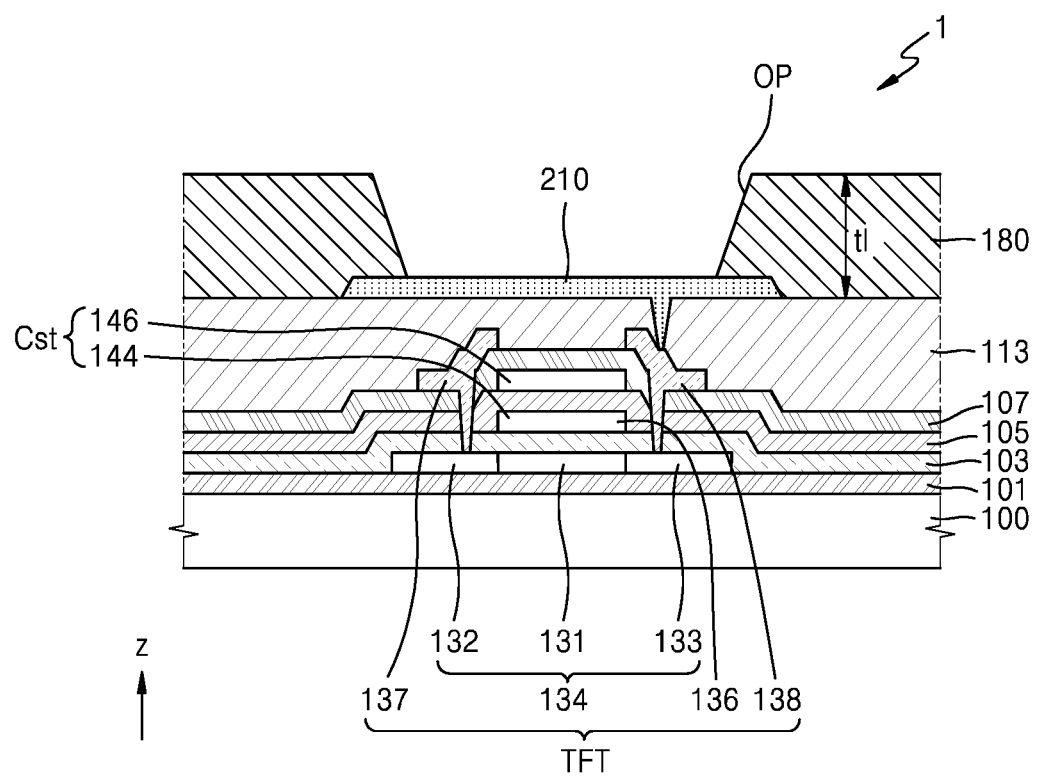

Referring to FIG. 6, an operation of forming a bank layer 180 on the first electrode 210, the bank layer 180 including an opening portion OP exposing at least a portion of the first electrode 210, may be performed after the operation of forming the first electrode 210 above the substrate 100.

In an embodiment, the bank layer 180 may include the opening portion OP exposing at least a portion of the first electrode 210 arranged under a portion of the bank layer 180. An area exposed by the opening portion OP of the bank layer 180 may be defined as an emission area. The periphery of the emission area is a non-emission area, and the non-emission area may surround emission areas.

In an embodiment, the bank layer 180 may include an organic insulating material such as PI, polyamide, acryl resin, BCB, HMDSO, phenol resin, etc. In addition, the bank layer 180 may include a material having liquid repellency. For example, the bank layer 180 may include a fluorine-based compound or a siloxane-based compound. In an embodiment, the bank layer 180 may include fluorine groups.

In an embodiment, the bank layer 180 may have a thickness t1 of 0.5 μm to 1.5 μm from an upper surface of the planarization layer 113 or the first electrode 210.

Figure 7:
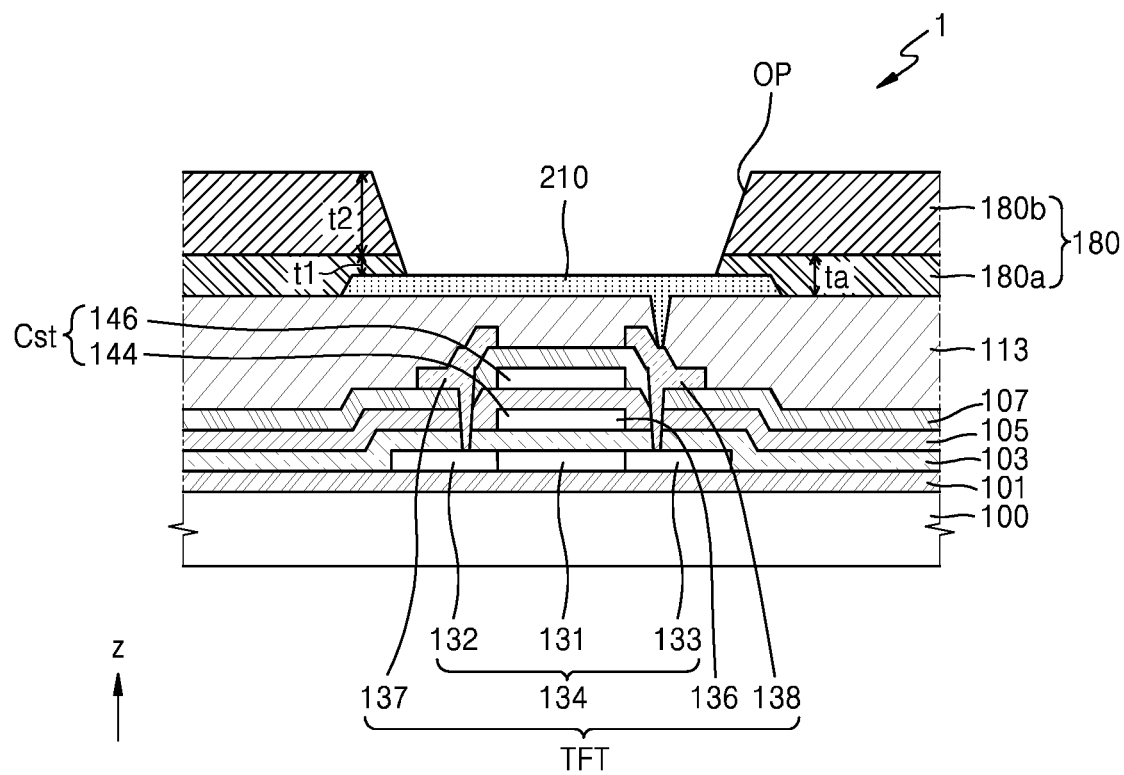

Referring to FIG. 7, an operation of baking the bank layer 180 may be performed after the operation of forming the bank layer 180 on the first electrode 210, the bank layer 180 including the opening portion OP exposing at least a portion of the first electrode 210. A first bank layer 180*a* and a second bank layer 180*b* may be formed through the operation of baking the bank layer 180. In an embodiment, the first bank layer 180*a* and the second bank layer 180*b* on the first bank layer 180*a* and having liquid repellency may be formed by baking the bank layer 180.

In an embodiment, the bank layer 180 may include the first bank layer 180*a* and the second bank layer 180*b*. In this regard, the first bank layer 180*a* may be a lower portion of the bank layer 180, and the second bank layer 180*b* may be an upper portion of the bank layer 180.

In an embodiment, the bank layer 180 may include fluorine groups, and the fluorine groups included in the bank layer 180 may move (diffuse) to an upper portion and/or a surface of the bank layer 180 through a process of baking the bank layer 180. In an embodiment, because fluorine groups included in the bank layer 180 move (diffuse) to an upper portion and/or a surface of the bank layer 180 through a baking process, a portion of the bank layer 180 having a high concentration of fluorine groups may be the second bank layer 180*b*, and a portion of the bank layer 180 having a lower concentration of fluorine groups than the second bank layer 180*b* may be the first bank layer 180*a*. That is, the bank layer 180 may include the first bank layer 180*a* and the second bank layer 180*b*, and the first bank layer 180*a* may include few fluorine groups and the second bank layer 180*b* may include more fluorine groups than the first bank layer 180*a*. Accordingly, the second bank layer 180*b* may have liquid repellency. For example, a surface (e.g., an upper surface and a side surface) of the second bank layer 180*b* may have liquid repellency.

In the present description, liquid repellency refers to a property that repels a certain solution and prevents the solution from penetrating well into a surface. A lyophilic property refers to a property that has excellent affinity for a certain solution. For example, a certain solution may have low surface bonding strength with a liquid-repellent surface and may have excellent surface bonding strength with a lyophilic surface.

In an embodiment, the operation of baking the bank layer 180 may be an operation of baking the bank layer 180 at a temperature of 150° C. to 250° C. for 8 to 12 minutes. When a baking temperature of the bank layer 180 is less than 150° C., fluorine groups included in the bank layer 180 move (diffuse) to an upper portion and/or a surface of the bank layer 180 at a low speed, and thus, a process time to form the first bank layer 180*a* and the second bank layer 180*b* may increase. On the other hand, when a baking temperature of the bank layer 180 is greater than 250° C., a movement (diffusion) speed of fluorine groups included in the bank layer 180 is too high to control positions of the fluorine groups, and thus, a thickness variation of films to be formed on the first electrode 210 at least partially exposed by the bank layer 180 may increase.

When a baking time of the bank layer 180 is less than 8 minutes, the first bank layer 180*a* is formed to be thin, and thus, an edge portion of a film to be formed on the first electrode 210 at least partially exposed by the bank layer 180 becomes thin, and a center portion of the film is formed to be thick, which may increase a thickness deviation between the edge portion and the center portion, thereby degrading emission efficiency of the organic light-emitting diode OLED. On the other hand, when a baking time of the bank layer 180 is greater than 12 minutes, the first bank layer 180*a* is formed to be thick, and thus, films are formed in an unintended portion (or an untargeted portion), which may lead to a defect in the organic light-emitting diode OLED.

Accordingly, when the bank layer 180 is baked at a temperature of 150° C. to 250° C. for 8 to 12 minutes, movement (diffusion) of fluorine groups included in the bank layer 180 to an upper portion and a surface of the bank layer 180 may be controlled, and thus, the occurrence of a thickness deviation of films to be formed in the bank layer 180 may be prevented or reduced, and the films may be formed in a uniform thickness.

Figure 8:
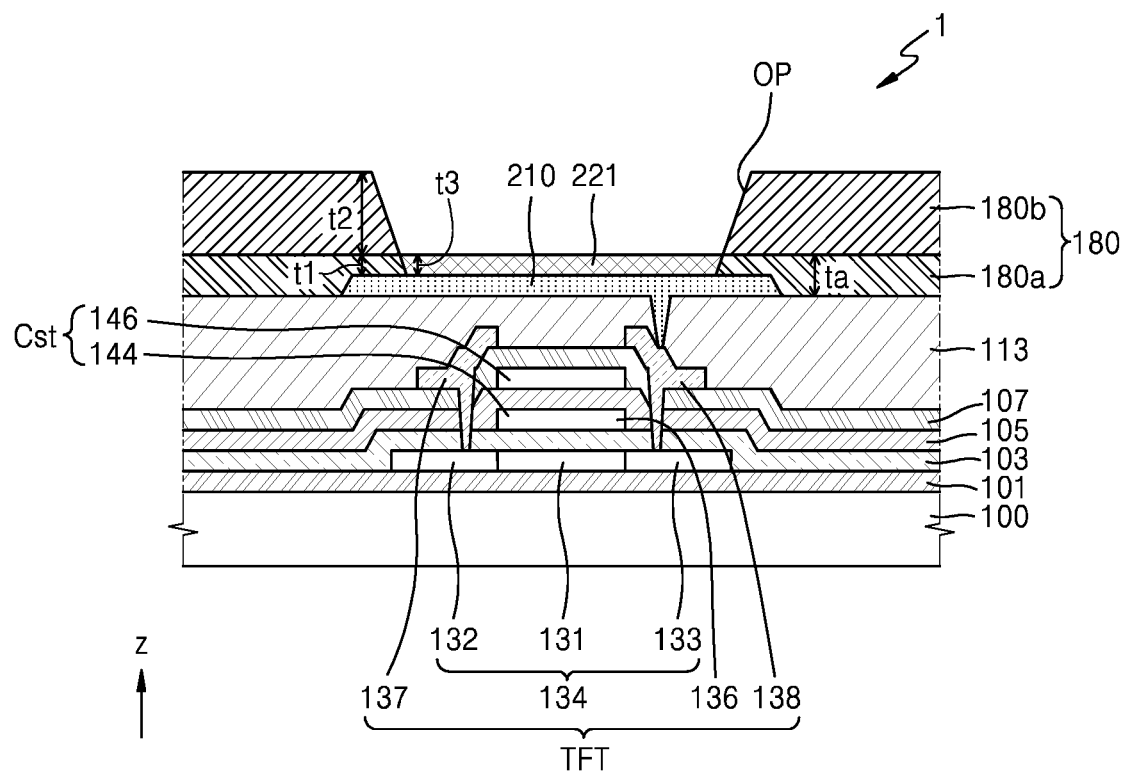

Referring to FIG. 8, an operation of forming a first layer 221 on the first electrode 210 may be formed after the operation of baking the bank layer 180 to form the first bank layer 180*a* and the second bank layer 180*b* on the first bank layer 180*a* and having liquid repellency.

In an embodiment, the first layer 221 may be formed on the first electrode 210 in the opening portion OP defined in the bank layer 180. In an embodiment, the first layer 221 may be formed on the first electrode 210 by a solution process. For example, the first layer 221 may be formed on the first electrode 210 by an inkjet printing process.

In an embodiment, after a material used to form the first layer 221 is printed on the first electrode 210 by a solution process, a process of drying a solvent included in the material may be performed.

In an embodiment, a side surface of the first layer 221 formed on the first electrode 210 may directly contact a side surface of the first bank layer 180*a* and may not directly contact a side surface of the second bank layer 180*b*.

The first layer 221 may be formed on the first electrode 210 so as to correspond to the first electrode 210. However, when the bank layer 180 does not have liquid repellency, a material used to form the first layer 221 may also be formed (or printed) on an upper surface of the bank layer 180 and/or a side surface of the bank layer 180 to cause a defect in the organic light-emitting diode OLED. When only an uppermost portion of the bank layer 180 has liquid repellency, a material used to form the first layer 221 may be formed (or printed) on a side surface of the bank layer 180 to cause a defect in the organic light-emitting diode OLED. When all portions of the bank layer 180 have liquid repellency, a thickness deviation between a center portion of the first layer 221 and an edge portion of the first layer 221 adjacent to the bank layer 180 may occur, and due to the thickness deviation, an emission efficiency deviation of the organic light-emitting diode OLED may occur.

Referring to FIGS. 7 and 8, in an embodiment, the first bank layer 180*a* may be on the planarization layer 113 and the first electrode 210, and the second bank layer 180*b* may be on the first bank layer 180*a*. The first bank layer 180*a* may have a thickness to from an upper surface of the planarization layer 113 to a bottom surface of the second bank layer 180*b*. In an embodiment, the first bank layer 180*a* may have a first thickness t1 from an upper surface of the first electrode 210 in a thickness direction (Z-direction) of the substrate 100, and the second bank layer 180*b* may have a second thickness t2 from an upper surface of the first bank layer 180*a* in the thickness direction (Z-direction) of the substrate 100 to a top surface thereof. In an embodiment, the first layer 221 may have a third thickness t3 from an upper surface of the first electrode 210 in a thickness direction (Z-direction) of the substrate 100. In this regard, the third thickness t3 of the first layer 221 may be equal to or less than the first thickness t1 of the first bank layer 180*a*.

In an embodiment, by controlling a temperature and time to bake the bank layer 180 to adjust liquid repellency of the bank layer 180, the first layer 221 may be formed in a uniform thickness on the first electrode 210 at least partially exposed by the bank layer 180, and by forming the first layer 221 in a uniform thickness, the occurrence of an emission efficiency deviation of the organic light-emitting diode OLED may be prevented or reduced.

Specifically, during a process of forming the first bank layer 180a and the second bank layer 180b having liquid repellency by baking the bank layer 180, the first layer 221 to be formed in the bank layer 180 may be formed in a uniform thickness by forming a thickness of the first bank layer 180a (e.g., the first thickness t1) equal to or similar to a thickness (e.g., the third thickness t3) of the first layer 221 to be formed in a subsequent process, and the occurrence of an emission efficiency deviation of the organic light-emitting diode OLED may be prevented or reduced by forming the first layer 221 in a uniform thickness. The combined thickness of the first bank layer 180a and the second bank layer 180b is formed to be substantially the same as the thickness t1 of the bank layer 180.

In an embodiment, the first layer 221 may be at least one of the HIL, the HTL, the EML, the ETL, and the EIL described above. However, the disclosure is not limited thereto.

Figure 9:
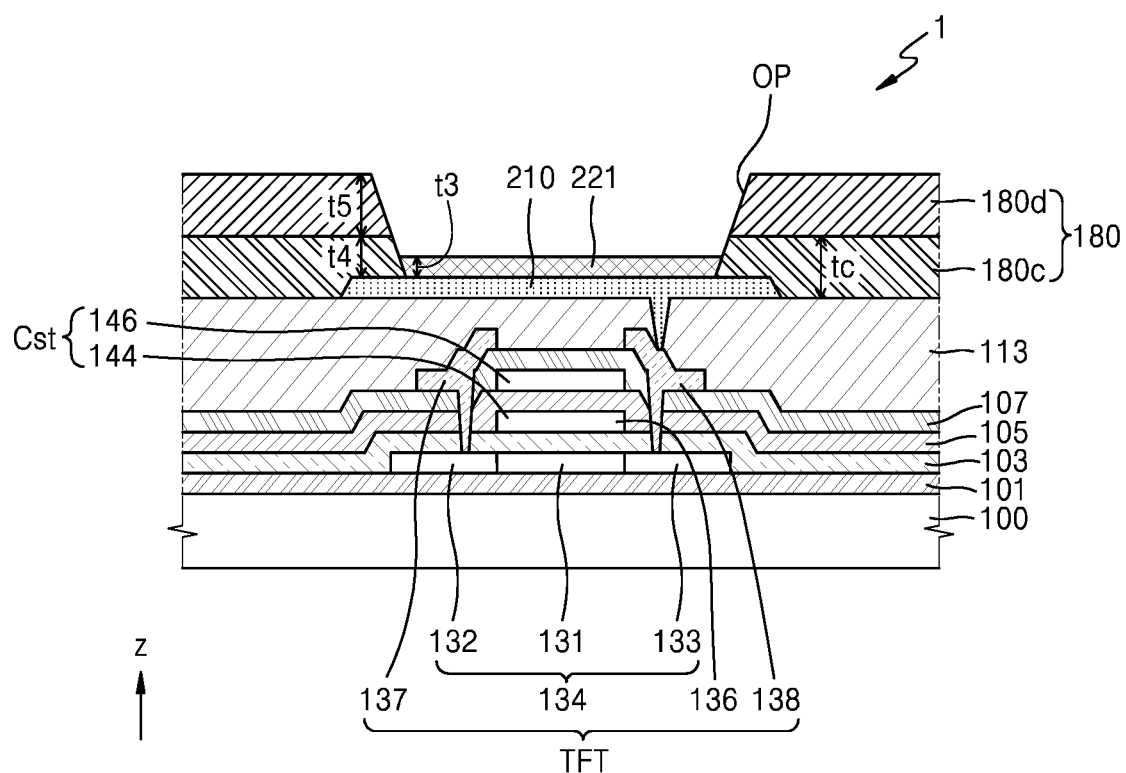

Referring to FIG. 9, an operation of baking the first bank layer 180a and the second bank layer 180b may be performed after the operation of forming the first layer 221 on the first electrode 210. A third bank layer 180c and a fourth bank layer 180d may be formed through the operation of baking the first bank layer 180a and the second bank layer 180b respectively. In an embodiment, the third bank layer 180c and the fourth bank layer 180d disposed on the third bank layer 180c and having liquid repellency may be formed by baking the first bank layer 180a and the second bank layer 180b.

In an embodiment, the first bank layer 180a and the second bank layer 180b may be baked after the operation of forming the first layer 221 on the first electrode 210. That is, while the first bank layer 180a and the second bank layer 180b are baked, the first layer 221 may also be baked.

In an embodiment, the bank layer 180 may include the third bank layer 180c and the fourth bank layer 180d. In this regard, the third bank layer 180c may be a lower portion of the bank layer 180, and the fourth bank layer 180d may be an upper portion of the bank layer 180. In an embodiment, the third bank layer 180c may be a layer formed by baking the first bank layer 180a and at least a portion of the second bank layer 180b, and the fourth bank layer 180d may be a layer formed by baking at least a portion of the second bank layer 180b.

In an embodiment, while the first bank layer 180a and the second bank layer 180b are baked, fluorine groups included in the second bank layer 180b may move (or diffuse) to an upper portion and/or a surface of the second bank layer 180b, thereby forming the third bank layer 180c and the fourth bank layer 180d. Specifically, while the bank layer 180 including the first bank layer 180a and the second bank layer 180b is baked, fluorine groups included in the bank layer 180 (e.g., the second bank layer 180b) may move (or diffuse) to an upper portion and/or a surface of the bank layer 180 (e.g., the second bank layer 180b), thereby forming the fourth bank layer 180d having liquid repellency and forming the third bank layer 180c under the fourth bank layer 180d. The third bank layer 180c may be a portion that does not have liquid repellency, and the fourth bank layer 180d may be a portion that has liquid repellency. In this regard, a surface (e.g., an upper surface and a side surface) of the fourth bank layer 180d may have liquid repellency.

In an embodiment, a concentration of fluorine groups in the fourth bank layer 180d may be higher than a concentration of fluorine groups in the third bank layer 180c. For example, the fourth bank layer 180d may include more fluorine groups than the third bank layer 180c.

In an embodiment, the operation of baking the first bank layer 180a and the second bank layer 180b may be an operation of baking the first bank layer 180a and the second bank layer 180b at a temperature of 150° C. to 250° C. for 13 to 25 minutes. When a baking temperature of the first bank layer 180a and the second bank layer 180b is less than 150° C., fluorine groups included in the second bank layer 180b move (diffuse) to an upper portion and/or a surface of the second bank layer 180b at a low speed, and thus, a process time to form the third bank layer 180c and the fourth bank layer 180d may increase. On the other hand, when a baking temperature of the first bank layer 180a and the second bank layer 180b is greater than 250° C., a movement (diffusion) speed of fluorine groups included in the second bank layer 180b is too high to control positions of the fluorine groups, and thus, a thickness variation of films to be formed in the opening portion OP defined by the bank layer 180 may increase.

When a baking time of the first bank layer 180a and the second bank layer 180b is less than 13 minutes, the third bank layer 180c is thin, and thus, an edge portion of a film to be formed in the bank layer 180 is thin, and a center portion of the film is thick, which may increase a thickness deviation between the edge portion and the center portion, thereby degrading emission efficiency of the organic light-emitting diode OLED. On the other hand, when a baking time of the first bank layer 180a and the second bank layer 180b is greater than 25 minutes, the third bank layer 180c is thick, and thus, films are formed in an unintended portion, which may lead to a defect in the organic light-emitting diode OLED.

Accordingly, when the bank layer 180 is baked at a temperature of 150° C. to 250° C. for 13 to 25 minutes, movement (diffusion) of fluorine groups included in the bank layer 180 (e.g., the second bank layer 180b) to an upper portion and a surface of the bank layer 180 (e.g., the second bank layer 180b) may be controlled, and thus, the occurrence of a thickness deviation of films to be formed in the bank layer 180 may be prevented or reduced, and the films may be formed in a uniform thickness.

Figure 10:
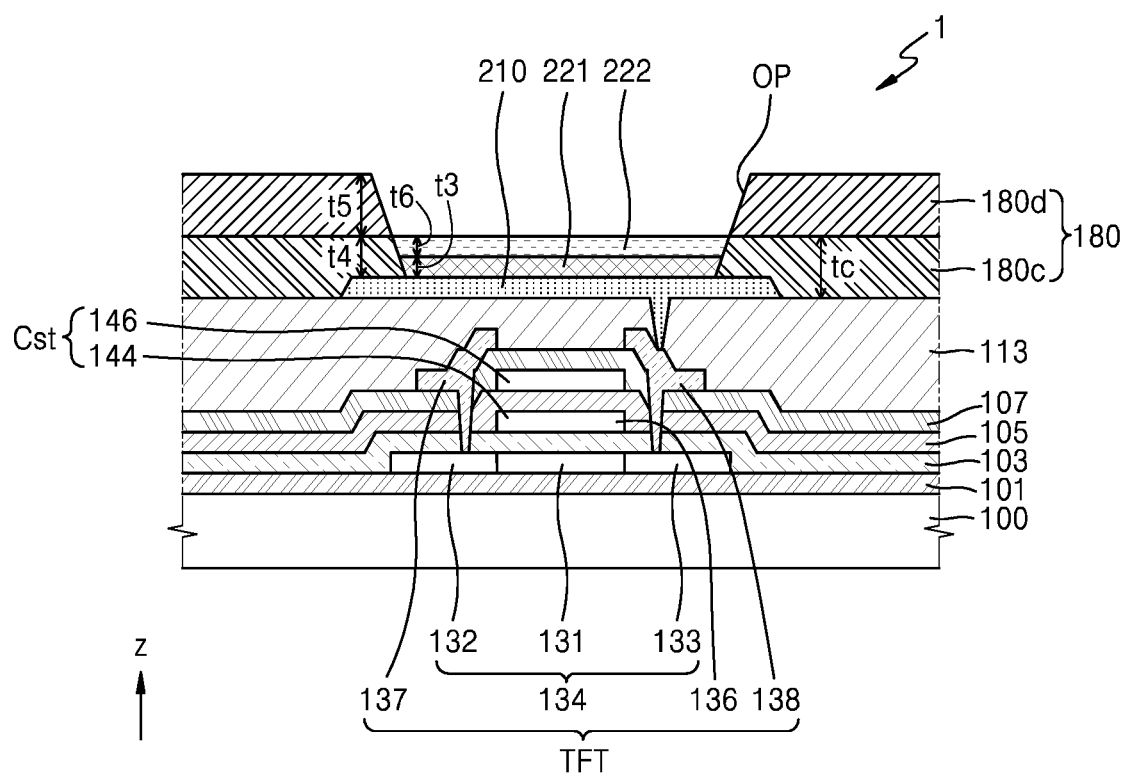

Referring to FIG. 10, an operation of forming a second layer 222 on the first layer 221 may be performed after the operation of forming the third bank layer 180c and the fourth bank layer 180d on the third bank layer 180c and having liquid repellency by baking the first bank layer 180a and the second bank layer 180b.

In an embodiment, the second layer 222 may be formed on the first layer 221 in the opening portion OP defined in the bank layer 180. In an embodiment, the second layer 222 may be formed on the first layer 221 by a solution process. For example, the second layer 222 may be formed on the first layer 221 by an inkjet printing process.

In an embodiment, after a material used to form the second layer 222 is printed on the first layer 221 by a solution process, a process of drying a solvent included in the material may be performed.

In an embodiment, the second layer 222 formed on the first layer 221 may directly contact a side surface of the third bank layer 180c and may not directly contact a side surface of the fourth bank layer 180d.

Referring to FIGS. 9 and 10, in an embodiment, the third bank layer 180c may be disposed on the planarization layer 113 and the first electrode 210, and the fourth bank layer 180d may be on the third bank layer 180c. The third bank layer 180c may have a thickness tc from an upper surface of the planarization layer 113 to a bottom surface of the fourth bank layer 180d. In an embodiment, the third bank layer 180c may have a fourth thickness t4 from an upper surface of the first electrode 210 in a thickness direction (Z-direction) of the substrate 100, and the fourth bank layer 180d may have a fifth thickness t5 from an upper surface of the third bank layer 180c in the Z-direction of the substrate 100 to an upper surface of the fourth bank layer 180d. In an embodiment, the second layer 222 may have a sixth thickness t6 from an upper surface of the first layer 221 in the Z-direction. In this regard, a thickness (e.g., the fourth thickness t4) of the third bank layer 180c may be greater than a thickness (e.g., the sixth thickness t6) of the second layer 222. In addition, the thickness (e.g., the fourth thickness t4) of the third bank layer 180c may be equal to or greater than a sum of a thickness (e.g., the third thickness t3) of the first layer 221 and the thickness (e.g., the sixth thickness t6) of the second layer 222.

Thus the thickness tc of the third bank layer 180c may be formed to be thicker than the thickness to of first bank layer 180a. The thickness t5 of the fourth bank layer 180d may be formed to be thinner than a thickness t2 of the second bank layer 180b. The combined thickness of the first bank layer 180a and the second bank layer 180b is formed to be substantially the same as the combined thickness of the third bank layer 180c and the fourth bank layer 180d.

In an embodiment, by controlling a temperature and time to bake the bank layer 180 to adjust liquid repellency of the bank layer 180, the second layer 222 to be formed in the bank layer 180 may be formed in a uniform thickness, and by forming the second layer 222 in a uniform thickness, the occurrence of an emission efficiency deviation of the organic light-emitting diode OLED may be prevented or reduced.

Specifically, during a process of forming the third bank layer 180c and the fourth bank layer 180d having liquid repellency by baking the bank layer 180 (e.g., the first bank layer 180a and the second bank layer 180b), the second layer 222 to be formed in the bank layer 180 may be formed in a uniform thickness by forming a thickness (e.g., the fourth thickness t4) of the third bank layer 180c equal to or similar to a sum of a thickness (e.g., the third thickness t3) of the first layer 221 and a thickness (e.g., the sixth thickness t6) of the second layer 222 to be formed in a subsequent process, and the occurrence of an emission efficiency deviation of the organic light-emitting diode OLED may be prevented or reduced by forming the second layer 222 in a uniform thickness.

In an embodiment, the second layer 222 may be at least one of the HIL, the HTL, the EML, the ETL, and the EIL described above. However, the disclosure is not limited thereto.

In an embodiment, when the first layer 221 is formed to be an HIL, the second layer 222 may be formed to be at least one of an HTL and an EML, and when the first layer 221 is formed to be an HTL, the second layer 222 may be formed to be an EML. However, the disclosure is not limited thereto.

Referring to FIGS. 8 and 10, for films formed in the bank layer 180 to have a uniform thickness, a thickness of a liquid-repellent portion of the bank layer 180 has to gradually decrease as processes proceed, and accordingly, a thickness (e.g., the first thickness t1) of the first bank layer 180a may be less than a thickness (e.g., the fourth thickness t4) of the third bank layer 180c, and a thickness (e.g., the second thickness t2) of the second bank layer 180b may be greater than a thickness (e.g., the fifth thickness t5) of the fourth bank layer 180d.

Figure 11:
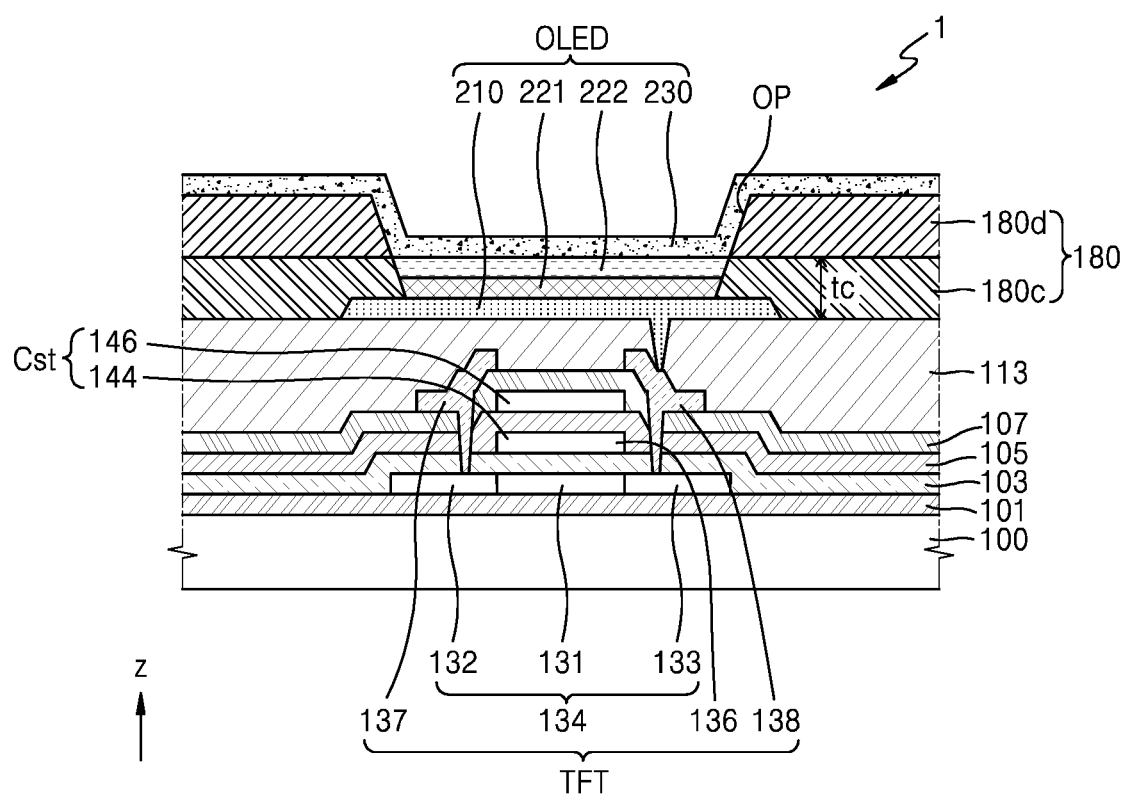

Referring to FIG. 11, an operation of forming a second electrode 230 above the first electrode 210 may be performed after the operation of forming the second layer 222 on the first layer 221.

In an embodiment, the second electrode 230 may at least partially overlap the first electrode 210. In an embodiment, the first layer 221 and/or the second layer 222 may be provided between the first electrode 210 and the second electrode 230. Although not illustrated, layers may be further provided between the first electrode 210 and the second electrode 230.

In an embodiment, the second electrode 230 may include a conductive material having a low work function. For example, the second electrode 230 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the second electrode 230 may further include a layer, such as ITO, IZO, ZnO, or $In_2O_3$, on a (semi)transparent layer including the material described above.

In an embodiment, the first electrode 210, the first layer 221, the second layer 222, and the second electrode 230 sequentially stacked may constitute the organic light-emitting diode OLED. In this regard, the first layer 221 and/or the second layer 222 may be at least one of an HIL, an HTL, and an EML. Although not illustrated, an ETL and/or an EIL may be further formed between the first electrode 210 and the second electrode 230.

Figure 12:
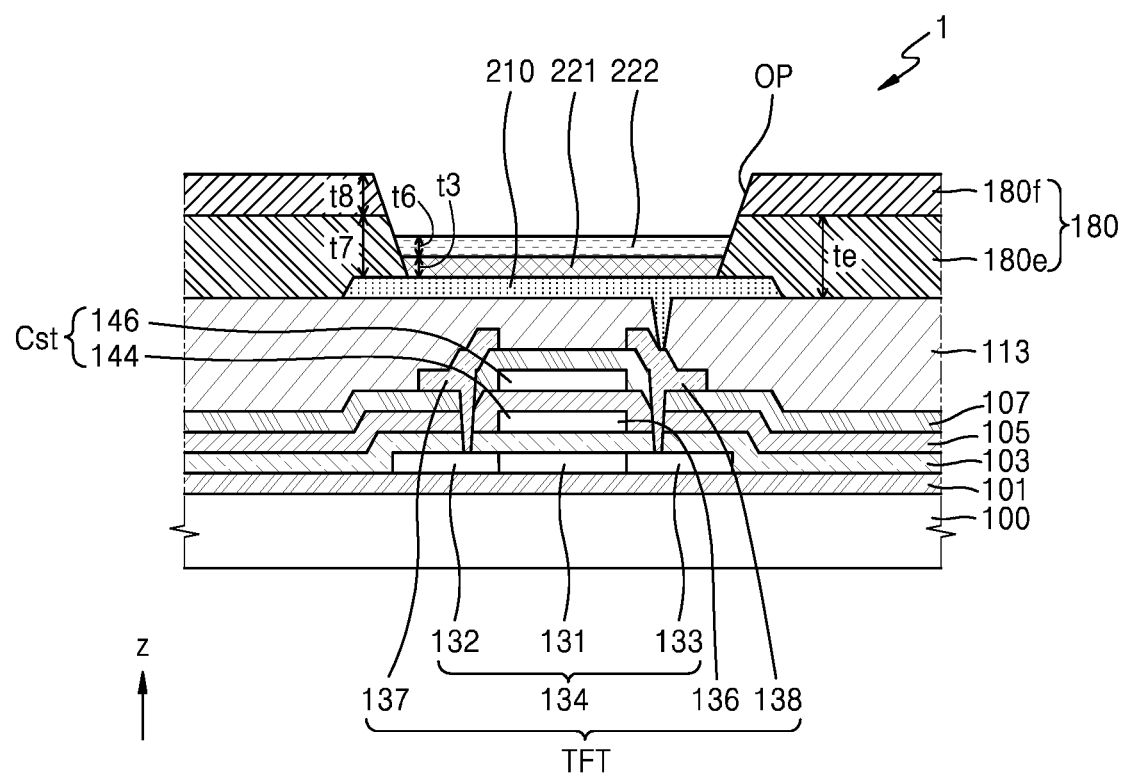

Referring to FIG. 12, an operation of baking the third bank layer 180c and the fourth bank layer 180d may be performed after the operation of forming the second layer 222 on the first layer 221. A fifth bank layer 180e and a sixth bank layer 180f may be formed through the operation of baking the third bank layer 180c and the fourth bank layer 180d. In an embodiment, the fifth bank layer 180e and the sixth bank layer 180f on the fifth bank layer 180e and having liquid repellency may be formed by baking the third bank layer 180c and the fourth bank layer 180d.

In an embodiment, the third bank layer 180c and the fourth bank layer 180d may be baked after the operation of forming the second layer 222 on the first layer 221. In an embodiment, while the third bank layer 180c and the fourth bank layer 180d are baked, the second layer 222 may also be baked.

In an embodiment, the bank layer 180 may include the fifth bank layer 180e and the sixth bank layer 180f. In this regard, the fifth bank layer 180e may be a lower portion of the bank layer 180, and the sixth bank layer 180f may be an upper portion of the bank layer 180. In an embodiment, the fifth bank layer 180e may be a layer formed by baking the third bank layer 180c and at least a portion of the fourth bank layer 180d, and the sixth bank layer 180f may be a layer formed by baking at least a portion of the fourth bank layer 180d.

In an embodiment, while the third bank layer 180c and the fourth bank layer 180d are baked, fluorine groups included in the fourth bank layer 180d may move (or diffuse) to an upper portion and/or a surface of the fourth bank layer 180d, thereby forming the fifth bank layer 180e and the sixth bank layer 180f. Specifically, while the bank layer 180 including the third bank layer 180c and the fourth bank layer 180d is baked, fluorine groups included in the bank layer 180 (e.g., the fourth bank layer 180d) may move (or diffuse) to an upper portion and/or a surface of the bank layer 180 (e.g., the fourth bank layer 180d), thereby forming the sixth bank layer 180f having liquid repellency and forming the fifth bank layer 180e under the sixth bank layer 180f. The fifth bank layer 180e may be a portion that does not have liquid repellency, and the sixth bank layer 180f may be a portion that has liquid repellency. In this regard, a surface (e.g., an upper surface and a side surface) of the sixth bank layer 180f may have liquid repellency. In an embodiment, a concentration of fluorine groups in the sixth bank layer 180f may be higher than a concentration of fluorine groups in the fifth bank layer 180e. For example, the sixth bank layer 180f may include more fluorine groups than the fifth bank layer 180e.

In an embodiment, the operation of baking the third bank layer 180c and the fourth bank layer 180d may be an operation of baking the third bank layer 180c and the fourth bank layer 180d at a temperature of 150° C. to 250° C. for 13 to 25 minutes. When a baking temperature of the third bank layer 180c and the fourth bank layer 180d is less than 150° C., fluorine groups included in the fourth bank layer 180d move (diffuse) to an upper portion and/or a surface of the fourth bank layer 180d at a low speed, and thus, a process time to form the fifth bank layer 180e and the sixth bank layer 180f may increase. On the other hand, when a baking temperature of the third bank layer 180c and the fourth bank layer 180d is greater than 250° C., a movement (diffusion) speed of fluorine groups included in the fourth bank layer 180d is too high to control positions of the fluorine groups, and thus, a thickness variation of films to be formed in the bank layer 180 may increase.

When a baking time of the third bank layer 180c and the fourth bank layer 180d is less than 13 minutes, the fifth bank layer 180e is thin, and thus, an edge portion of a film to be formed in the bank layer 180 is thin, and a center portion of the film is thick, which may increase a thickness deviation between the edge portion and the center portion, thereby degrading emission efficiency of the organic light-emitting diode OLED. On the other hand, when a baking time of the third bank layer 180c and the fourth bank layer 180d is greater than 25 minutes, the fifth bank layer 180e is thick, and thus, films are formed in an unintended portion, which may lead to a defect in the organic light-emitting diode OLED.

Accordingly, when the bank layer 180 is baked at 150° C. to 250° C. for 13 to 25 minutes, movement (diffusion) of fluorine groups included in the bank layer 180 (e.g., the fourth bank layer 180d) to an upper portion and a surface of the bank layer 180 (e.g., the fourth bank layer 180d) may be controlled, and thus, the occurrence of a thickness deviation of films to be formed in the bank layer 180 may be prevented or reduced, and the films may be formed in a uniform thickness.

Figure 13:
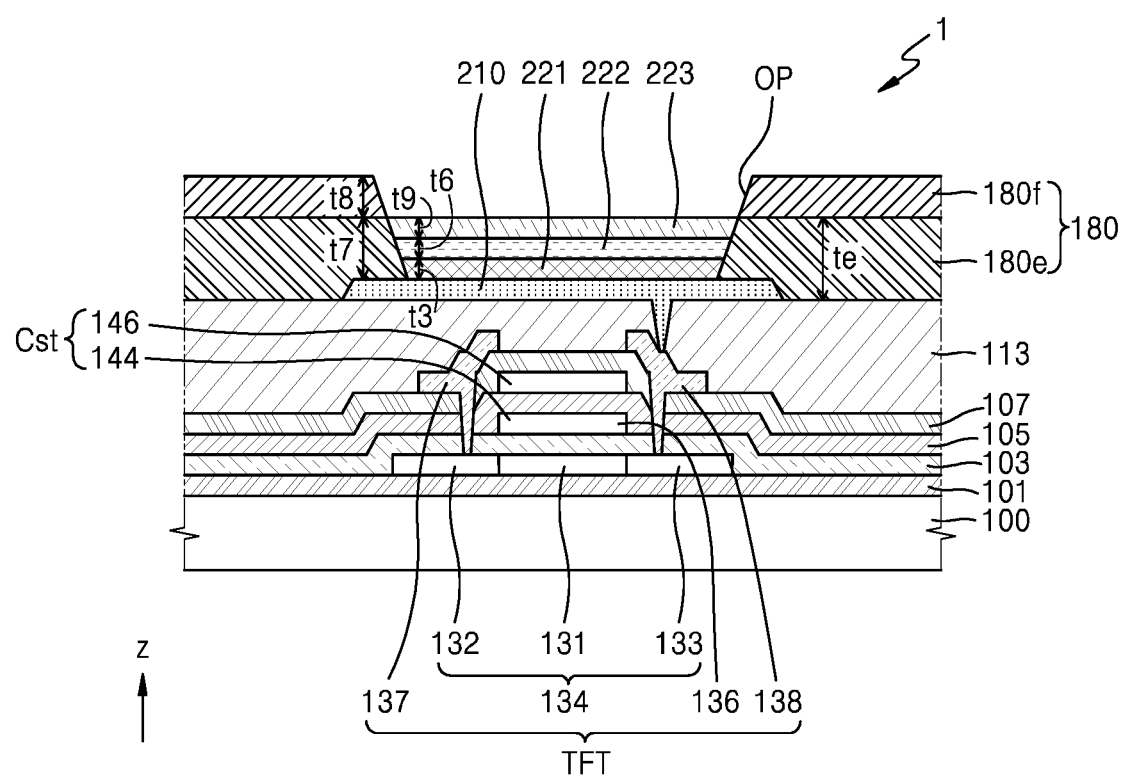

Referring to FIG. 13, an operation of forming a third layer 223 on the second layer 222 may be performed after the operation of forming the fifth bank layer 180e and the sixth bank layer 180f on the fifth bank layer 180e and having liquid repellency by baking the third bank layer 180c and the fourth bank layer 180d.

In an embodiment, the third layer 223 may be formed on the second layer 222 in the opening portion OP defined in the bank layer 180. In an embodiment, the third layer 223 may be formed on the second layer 222 by a solution process. For example, the third layer 223 may be formed on the second layer 222 by an inkjet printing process.

In an embodiment, after a material used to form the third layer 223 is printed on the second layer 222 by a solution process, a process of drying a solvent included in the material may be performed.

In an embodiment, the third layer 223 formed on the second layer 222 may directly contact a side surface of the fifth bank layer 180e and may not directly contact a side surface of the sixth bank layer 180f.

Referring to FIGS. 12 and 13, in an embodiment, the fifth bank layer 180e may be disposed on the planarization layer 113 and the first electrode 210, and the sixth bank layer 180f may be on the fifth bank layer 180e. The fifth bank layer 180e may have a thickness to from an upper surface of the planarization layer 113 to a bottom surface of the sixth bank layer 180f. In an embodiment, the fifth bank layer 180e may have a seventh thickness t7 from an upper surface of the first electrode 210 in a thickness direction of the substrate 100, and the sixth bank layer 180f may have an eighth thickness t8 from an upper surface of the fifth bank layer 180e in the thickness direction of the substrate 100. In an embodiment, the third layer 223 may have a ninth thickness t9 from an upper surface of the second layer 222 in a thickness direction of the substrate 100. In this regard, a thickness (e.g., the seventh thickness t7) of the fifth bank layer 180e may be greater than a thickness (e.g., the ninth thickness t9) of the third layer 223. In addition, the thickness (e.g., the seventh thickness t7) of the fifth bank layer 180e may be equal to or greater than a sum of a thickness (e.g., the third thickness t3) of the first layer 221, a thickness (e.g., the sixth thickness t6) of the second layer 222, and the thickness (e.g., the ninth thickness t9) of the third layer 223.

Thus the thickness te of the fifth bank layer 180e may be formed to be thicker than the thickness tc of third bank layer 180c. The thickness t8 of the sixth bank layer 180d may be formed to be thinner than a thickness t5 of the fourth bank layer 180d. The combined thickness of the third bank layer 180c and the fourth bank layer 180d is formed to be substantially the same as the combined thickness of the fifth bank layer 180e and the sixth bank layer 180f.

In an embodiment, by controlling a temperature and time to bake the bank layer 180 to adjust liquid repellency of the bank layer 180, the third layer 223 to be formed in the bank layer 180 may be formed in a uniform thickness, and by forming the third layer 223 in a uniform thickness, the occurrence of an emission efficiency deviation of the organic light-emitting diode OLED may be prevented or reduced.

Specifically, during a process of forming the fifth bank layer 180e and the sixth bank layer 180f having liquid repellency by baking the bank layer 180 (e.g., the third bank layer 180c and the fourth bank layer 180d), the third layer 223 to be formed in the bank layer 180 may be formed in a uniform thickness by forming a thickness (e.g., the seventh thickness t7) of the fifth bank layer 180e equal to or similar to a sum of a thickness (e.g., the third thickness t3) of the first layer 221, a thickness (e.g., the sixth thickness t6) of the second layer 222, and a thickness (e.g., the ninth thickness t9) of the third layer 223 to be formed in a subsequent process, and the occurrence of an emission efficiency deviation of the organic light-emitting diode OLED may be prevented or reduced by forming the third layer 223 in a uniform thickness.

In an embodiment, the third layer 223 may be at least one of the HIL, the HTL, the EML, the ETL, and the EIL described above. However, the disclosure is not limited thereto.

In an embodiment, the first layer 221 may be formed to be an HIL, the second layer 222 may be formed to be an HTL, and the third layer 223 may be formed to be an EML. However, the disclosure is not limited thereto.

Referring to FIGS. 10 and 13, as films are formed in the bank layer 180, a thickness of a liquid-repellent portion of the bank layer 180 has to decrease, and accordingly, a thickness (e.g., the fourth thickness t4) of the third bank layer 180c may be less than a thickness (e.g., the seventh thickness t7) of the fifth bank layer 180e, and a thickness (e.g., the fifth thickness t5) of the fourth bank layer 180d may be greater than a thickness (e.g., the eighth thickness t8) of the sixth bank layer 180f.

Figure 14:
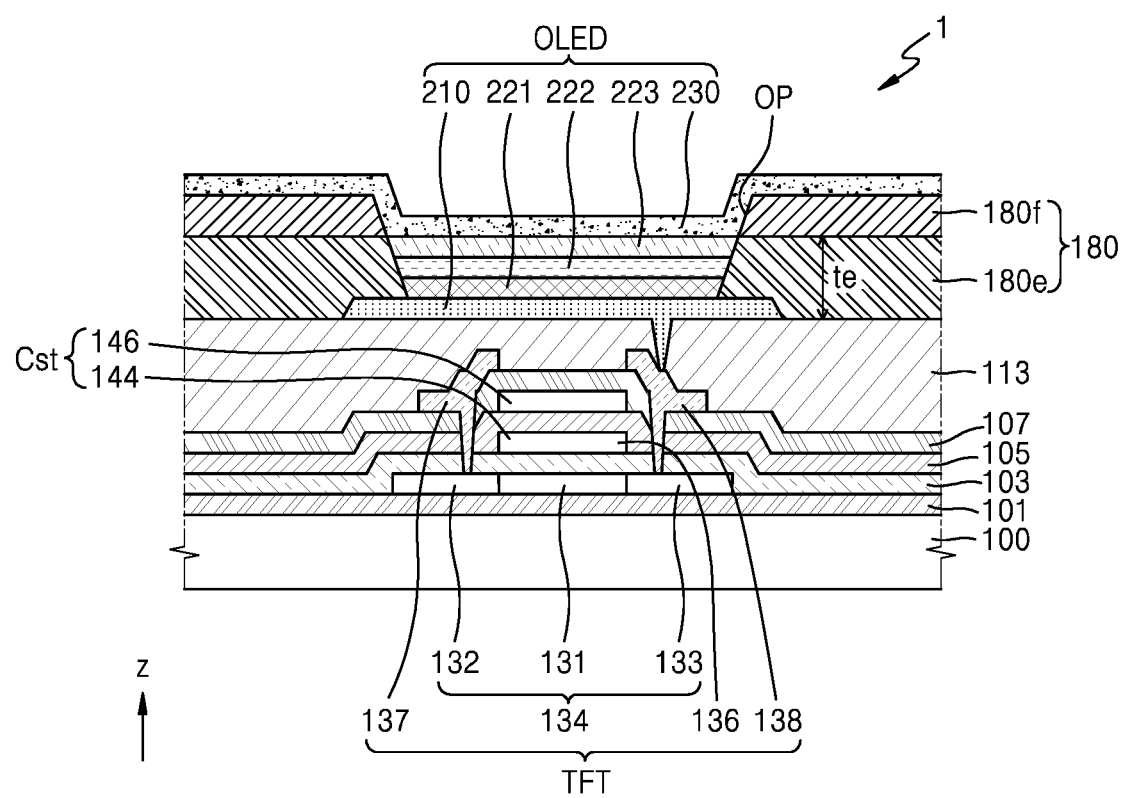

Referring to FIG. 14, an operation of forming the second electrode 230 above the first electrode 210 may be performed after the operation of forming the third layer 223 on the second layer 222.

In an embodiment, the second electrode 230 may at least partially overlap the first electrode 210. In an embodiment, at least one of the first layer 221, the second layer 222, and the third layer 223 may be provided between the first electrode 210 and the second electrode 230. Although not illustrated, an ETL and/or an EIL may be further provided between the first electrode 210 and the second electrode 230.

In an embodiment, the first electrode 210, the first layer 221, the second layer 222, the third layer 223, and the second electrode 230 sequentially stacked may constitute the organic light-emitting diode OLED. In this regard, the first layer 221, the second layer 222, and the third layer 223 may be at least one of an HIL, an HTL, and an EML, respectively. Although not illustrated, an ETL and/or an EIL may be further formed between the first electrode 210 and the second electrode 230.

According to one or more of the above-described embodiments, a method of manufacturing a display device whereby liquid repellency of a bank layer may be controlled by adjusting a temperature and time to bake the bank layer, and films may be formed in the bank layer to have a uniform thickness by controlling liquid repellency of the bank layer may be implemented. However, the disclosure is not limited by such an effect.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of manufacturing a display device, the method comprising:
   forming a first electrode on a substrate;
   forming a bank layer on the first electrode, wherein the bank layer includes an opening portion exposing at least a portion of the first electrode;
   forming a first bank layer and a second bank layer by baking the bank layer, wherein the second bank layer is on the first bank layer and has liquid repellency;
   forming a first layer on the first electrode; and
   forming a third bank layer and a fourth bank layer by baking the first bank layer and the second bank layer, wherein the fourth bank layer is on the third bank layer and has liquid repellency,
   wherein the fourth bank layer is thinner than the second bank layer.

2. The method of claim 1, wherein the forming of the first bank layer and the second bank layer by baking the bank layer comprises:
   forming the first bank layer and the second bank layer by baking the bank layer at 150° C. to 250° C. for 8 to 12 minutes.

3. The method of claim 2, wherein the first bank layer has a first thickness from an upper surface of the first electrode, and the second bank layer has a second thickness from an upper surface of the first bank layer.

4. The method of claim 3, wherein the first layer has a third thickness from the upper surface of the first electrode, and the third thickness is equal to or less than the first thickness.

5. The method of claim 4, wherein the forming of the third bank layer and the fourth bank layer by baking the first bank layer and the second bank layer comprises:
   forming the third bank layer and the fourth bank layer by baking the first bank layer and the second bank layer at 150° C. to 250° C. for 13 to 25 minutes.

6. The method of claim 5, wherein the third bank layer has a fourth thickness from the upper surface of the first electrode, and the fourth bank layer has a fifth thickness from an upper surface of the third bank layer.

7. The method of claim 6, wherein the fourth thickness is greater than the first thickness.

8. The method of claim 6, wherein the second thickness is greater than the fifth thickness.

9. The method of claim 6, further comprising:
   after the forming of the third bank layer and the fourth bank layer, forming a second layer on the first layer.

10. The method of claim 9, wherein the second layer has a sixth thickness from an upper surface of the first layer, and the fourth thickness is equal to or greater than a sum of the third thickness and the sixth thickness.

11. The method of claim 9, further comprising:
    after the forming of the second layer, forming a fifth bank layer and a sixth bank layer by baking the third bank layer and the fourth bank layer, wherein the sixth bank layer is on the fifth bank layer and has liquid repellency.

12. The method of claim 11, wherein the forming of the fifth bank layer and the sixth bank layer by baking the third bank layer and the fourth bank layer comprises:
    forming the fifth bank layer and the sixth bank layer by baking the third bank layer and the fourth bank layer at 150° C. to 250° C. for 13 to 25 minutes.

13. The method of claim 11, wherein the fifth bank layer has a seventh thickness from the upper surface of the first electrode, and the sixth bank layer has an eighth thickness from an upper surface of the fifth bank layer.

14. The method of claim 13, wherein the seventh thickness is greater than the fourth thickness.

15. The method of claim 13, wherein the eighth thickness is less than the fifth thickness.

16. The method of claim 11, further comprising:
    after the forming of the fifth bank layer and the sixth bank layer, forming a third layer on the second layer.

17. The method of claim 11, further comprising:
    forming a second electrode above the first electrode.

18. The method of claim 1, wherein the bank layer has a thickness of 0.5 µm to 1.5 µm.

19. The method of claim 1, wherein the first layer is formed by a solution process.

20. The method of claim 1, wherein the first layer is one of a hole injection layer, a hole transport layer, and an emission layer.

* * * * *